United States Patent [19]

Homma

[11] Patent Number: 5,444,023
[45] Date of Patent: Aug. 22, 1995

[54] METHOD OF FABRICATING A SEMICONDUCTOR DEVICE HAVING A MULTILAYER WIRING STRUCTURE AND USING A FLUORINE COMPOUND-CONTAINING GAS

[75] Inventor: Tetsuya Homma, Tokyo, Japan

[73] Assignee: NEC Corporation, Tokyo, Japan

[21] Appl. No.: 179,718

[22] Filed: Jan. 11, 1994

[30] Foreign Application Priority Data

Jan. 11, 1993 [JP] Japan .................... 5-002263

[51] Int. Cl.⁶ .................................. H01L 21/44
[52] U.S. Cl. .................................. 437/195; 437/231
[58] Field of Search .................................. 437/195, 231

[56] References Cited

U.S. PATENT DOCUMENTS

| | | |
|---|---|---|
| 5,288,518 | 2/1994 | Homma . |
| 5,306,665 | 4/1994 | Manabe .................... 437/195 |
| 5,334,552 | 8/1994 | Homma .................... 437/195 |
| 5,352,630 | 10/1994 | Kim et al. .................... 437/195 |
| 5,393,702 | 2/1995 | Yang et al. .................... 437/195 |

FOREIGN PATENT DOCUMENTS

| | | |
|---|---|---|
| 63-21850 | 1/1988 | Japan . |
| 64-47053 | 2/1989 | Japan . |
| 0574747 | 3/1993 | Japan . |
| 0582512 | 4/1993 | Japan . |
| 0590249 | 4/1993 | Japan . |

Primary Examiner—Brian E. Hearn
Assistant Examiner—Lynne A. Gurley
Attorney, Agent, or Firm—Sughrue, Mion, Zinn, Macpeak & Seas

[57] ABSTRACT

A spin coated insulating film is coated selectively between wirings by treating the surface of a wiring layer with a fluorine compound gas plasma. The spin on glass film is made compact by exposing it to fluoroalkoxysilane vapor to accelerate condensation and polymerization of the spin coated materials. A silicon oxide film is formed by plasma excited CVD to form a flat interlayer insulating film. A fine mutilayer wiring structure can be readily formed by employing the above mentioned planarizing method of the interlayer insulating film.

14 Claims, 6 Drawing Sheets

METHOD OF FABRICATING A SEMICONDUCTOR DEVICE HAVING A MULTILAYER WIRING STRUCTURE AND USING A FLUORINE COMPOUND-CONTAINING GAS

BACKGROUND OF THE INVENTION

1. Field of the Invention

The present invention relates to a method of fabricating a semiconductor device and, more particularly, to a method of planarizing an interlayer insulating film for a multilayer wiring structure.

2. Description of the Related Art

In the fabrication of a semiconductor device, a multilayer wiring structure has been conventionally formed as disclosed, for example, in Japanese Patent Laid Open No. S64-47053.

Namely, as shown in FIG. 1a, a first layer wiring 55 including an Al—Si alloy is formed on a semiconductor substrate 51. Next, as shown in FIG. 1b, a 200 nm-thick first insulating film 58 consisting of phosphosilicate glass (PSG) is formed on the entire surface by CVD method. Subsequently, a glass solution is spin coated at 5000 rpm, and the coating film is solidified by baking it for 1 min at 150° C. and for 30 min at 300° C. By repeating the spin coating and the baking of the glass solution for two or three times, a glass coating film 510 having a thickness of about 200 nm is formed on the wiring 55 as shown in FIG. 1c. Then, the whole surface of glass coating film 510 is etched all over the surface by 200 nm by reactive ion etching as shown in FIG. 1d. Next, as shown in FIG. 1e, a second insulating film 511 of PSG is formed to a thickness of 400 nm by CVD method. Subsequently, after forming a through hole 512 as shown in FIG. 1f, a two-layer wiring structure is formed by forming a second layer wiring 516 as shown in FIG. 1g.

In addition, in Japanese Patent Laid Open No. S63-21850 there is disclosed the formation of a planarized interlayer insulating film by a method in which a semiconductor substrate is immersed in a solution of material for the formation of a glass coating film or a polyimide film, as will be described in the following. Namely, as shown in FIGS. 2a and 2b, gate electrodes 65 are formed by etching a gate electrode film 64 using a photoresist film 67 as a mask. Next, a planarizing insulating film 610 is formed by immersing the etched gate electrode 65 together with the photoresist film 67 in a solution of material for forming glass coating film or a polyimide film, a so-called "SOG" (spin on glass) or the like as shown in FIG. 2c, and the substrate is subjected to a heat treatment. Further, after removal of the photoresist film as shown in FIG. 2d, a PSG or boron doped phosphosilicate glass (BPSG) insulating film 611 is deposited by, for example, a CVD method, then the film is subjected to a heat treatment. This achieves planarization of the interlayer insulating film.

However, the above-mentioned methods have the following problems. In the first mentioned method, in the isotropic etching process following the formation of the glass coating film, the glass coating film undergoes more etching than the PSG film 58 formed by the CVD method because the etching rate of the glass coating film 510 is higher compared with the same of PSG film 58, which deteriorates the flatness of the surface. Moreover, the thickness of the glass coating film above the wiring 55 depends on the width of the wiring 55. The thicker glass coating film on wider portions of the wiring pattern may not be fully etched even the glass coating film on a narrower portion of the wiring pattern is completely removed by the isotropic etching. When a second layer wiring is subsequently formed after formation of through holes, electric continuity may become lost due to oxidation of the surface of the lower wiring at the bottom of the through holes by the release of contained moisture or hygroscopic moisture in the glass coating film. These defects conspicuously spoil the production yield and the reliability of the semiconductor devices. Furthermore, due to the fact that sufficient flatness cannot be obtained even if planarization is attempted, control of the size of the photoresist pattern for the formation of the upper layer wiring becomes difficult, preventing formation of fine wirings.

In the second mentioned method, the following problems exist. First, because of the formation of a film on the photoresist film by the immersion of the substrate in a solution of material for the purpose of forming an SOG or a polyimide film, this method has a fatal defect that the photoresist film cannot easily be removed in a later step. Moreover, an ordinary SOG film has the drawback that cracks form in the SOG film when a film with thickness greater than 0.2 $\mu$m is formed, precluding the possibility of putting such a film to practical use. Furthermore, a heat treatment is required after immersion of the sample in the solution material for formation of the SOG film, but heat treatment at a temperature higher than 150° C. is not feasible because of the presence of the photoresist film. Insufficient heat treatment at low temperature causes the SOG film to melt when the photoresist film is subsequently removed and planarization is deteriorated.

A technique for forming a compact SOG film at low temperature has been proposed in Japanese Patent Application No. H3-234238 (Patent No. 05-74747), No. H3-242239 (Patent No. 05-82512) and No. H3-250781 (Patent No. 05-90249), according to which a SOG film is exposed to a fluoroalkoxysilane or a fluoroalkoxymetal containing vapor to accelerate condensation and polymerization reactions for formation of the SOG film.

BRIEF SUMMARY OF THE INVENTION

Accordingly, it is an object of the present invention to provide a method of fabricating a semiconductor device which overcomes the above mentioned problems of the prior methods.

One feature of the present invention resides in a method of fabricating a semiconductor device which includes the steps of forming a wiring on a first insulating film, treating the wiring with a fluorine compound-containing gas, then forming an SOG glass film on the first insulating film, exposing the SOG glass film to a fluoroalkoxysilane containing vapor, and forming a second insulating film on the wiring and the SOG film.

Another feature of the present invention resides in a method of fabricating a semiconductor device which includes the steps of forming a mask pattern of organic material on a metallic film formed on a first insulating film, etching the metallic film by using the mask pattern as a mask to form a wiring, treating the mask pattern with a fluorine compound-containing gas, forming an SOG film on the surface of the first insulating film (the metallic film on which is etched in the step of etching the metallic film) exposing the SOG film to the fluoroalkoxysilane-containing vapor, removing the mask pattern, and then forming a second insulating film on the wiring and the SOG film.

BRIEF DESCRIPTION OF THE DRAWINGS

The above and further objects, features and advantages of the present invention will become more apparent from the following detailed description of embodiments of the invention taken in conjunction with the accompanying drawings, wherein.

DETAILED DESCRIPTION OF THE PREFERRED EMBODIMENTS

Figure 1A:
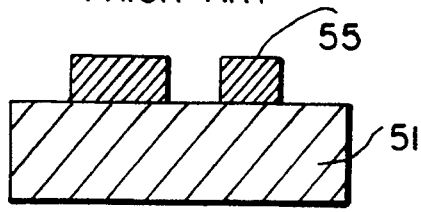
FIGS. 1a to 1g are sectional views illustrating in sequence a prior art method for fabricating a semiconductor device.
Figure 1B:
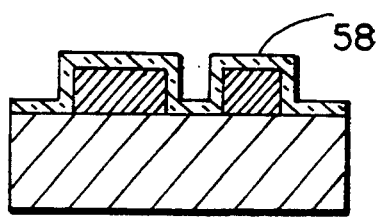
Figure 1C:
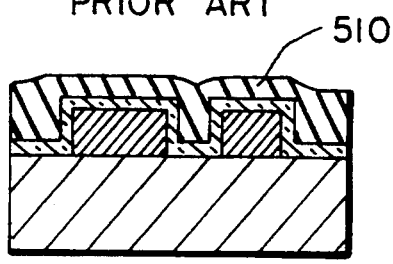
Figure 1D:
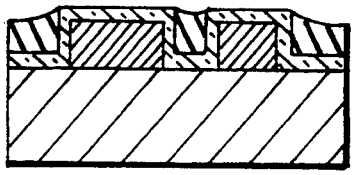
Figure 1E:
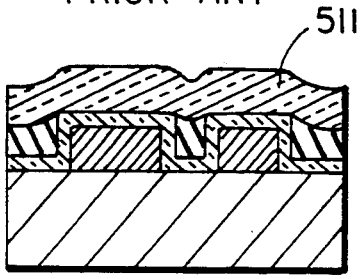
Figure 1F:
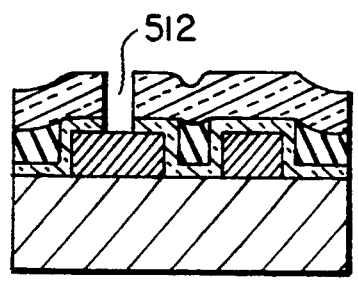
Figure 1G:
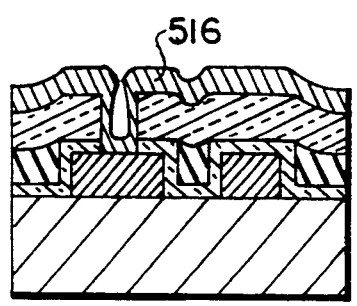
Figure 2A:
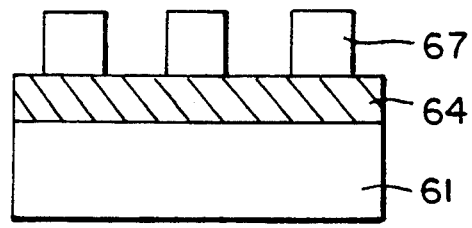
FIGS. 2a to 2e are sectional views illustrating in sequence another prior art method for fabricating a semiconductor device.
Figure 2B:
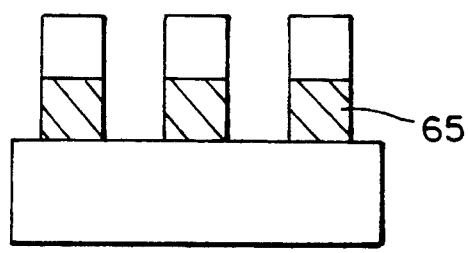
Figure 2C:
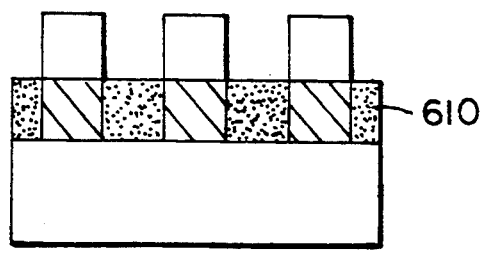
Figure 2D:
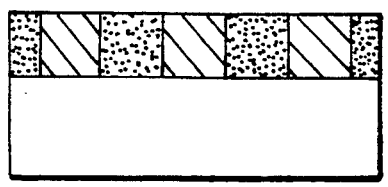
Figure 2E:
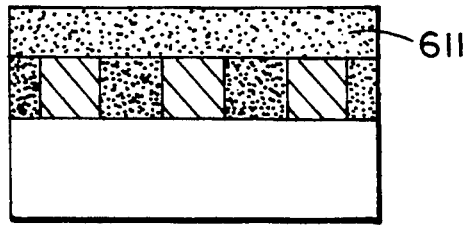
Figure 3A:
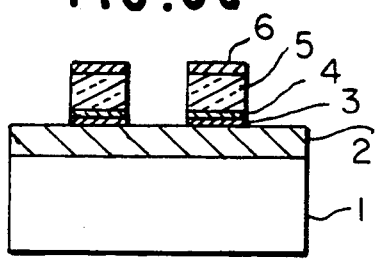
FIGS. 3a to 3h are sectional views illustrating in sequence a first embodiment of the method of the present invention.
Figure 3B:
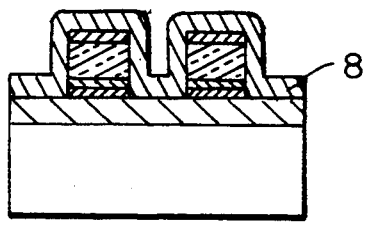
Figure 3C:
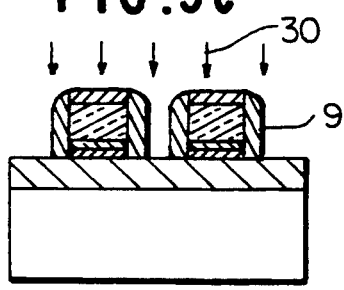
Figure 3D:
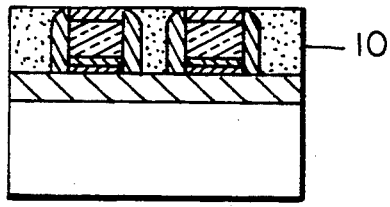
Figure 3E:
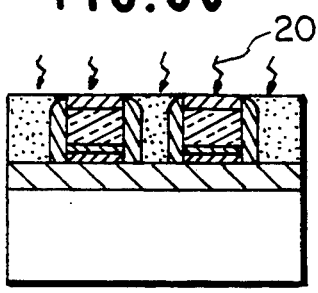
Figure 3F:
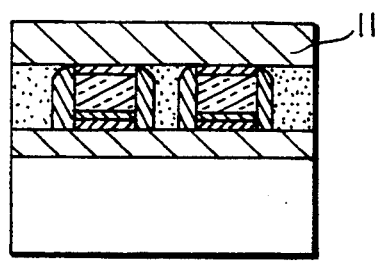
Figure 3G:
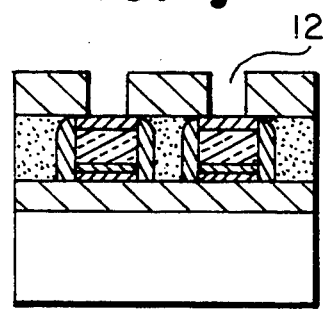
Figure 3H:
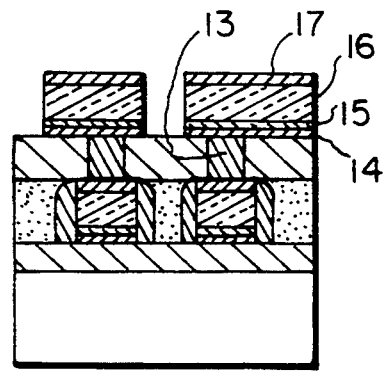

Referring now to FIGS. 3a to 3g which, as mentioned above, are sectional views illustrating in sequence a method of fabricating a semiconductor device including a two-layer-aluminum-wiring structure in accordance with the first embodiment of the present invention. As shown in FIG. 3a, after forming a BPSG film 2 having a thickness of about 0.8 $\mu$m on a semiconductor substrate 1 by a conventional CVD method, a first layer of a wiring including a titanium film 3 having a thickness of about 0.1 $\mu$m, a titanium nitride film 4 having a thickness of about 0.1 $\mu$m, an aluminum film 5 containing copper and silicon and having a thickness of about 0.5 $\mu$m and a titanium nitride film 6 having a thickness of about 0.1 $\mu$m is formed by conventional sputtering and lithography techniques. Next, as shown FIG. 3b, a silicon oxide film 8 having a thickness of about 0.3 $\mu$m is formed by a conventional plasma excited CVD method, and sidewalls 9 are formed as shown in FIG. 3c by etching film 8 for 6 min by reactive ion etching using a CF$_4$ gas at a gas pressure of 10 Pa and a high-frequency power of 1 kW. At this time, the surface of the titanium nitride film 6 at the top of the first layer of wiring is also treated by the CF$_4$ gas plasma 30 of the reactive ion etching. Following that, a SOG film 10 having a thickness of about 0.8 $\mu$m is formed by spin coating a solution containing 50 wt. % of a main ingredient which is an oligomer having molecular weight of 1000 g/mol formed using triethoxysilane [HSi(OC$_2$H$_5$)$_3$] as a starting material, and dibutylether as a solvent, the solution being spin coated for 20 sec at a rotational speed of 4000 rpm. This SOG film 10 is selectively formed at locations other than where the wirings are present as shown in FIG. 3d. The SOG film is not formed on the top of the wiring because of the above-discussed treatment of the titanium nitride layer 6 by the CF$_4$ gas during in the reactive ion etching. Then, as shown in FIG. 3e, condensation and polymerization of the SOG film 10 is accelerated to make it compact by exposing the SOG film 10 to fluorotriethoxysilane [FSi(OC$_2$H$_5$)$_3$] vapor for 20 for 60 min under a pressure of 760 Torr at a temperature of 25° C. Next, after N$_2$ annealing for 60 min at 300° C., a silicon oxide film 11 having a thickness of about 0.7 $\mu$m is formed by a plasma excited CVD method as shown in FIG. 3f. Then, through holes 12 are formed as shown in FIG. 3g by a conventional photolithography technique. Next, after forming a tungsten film on the entire surface by a CVD method, a tungsten film 13 is buried in the through holes by etching it back by reactive ion etching using SF$_6$ gas, then a second wiring layer including a titanium film 14 having a thickness of about 0.1 $\mu$m, a titanium nitride film 15 having a thickness of about 0.1 $\mu$m, a copper and silicon containing aluminum film 16 having a thickness of about 0.5 $\mu$m and a titanium nitride film 17 having a thickness of about 0.1 $\mu$m, is formed.

Figure 4:
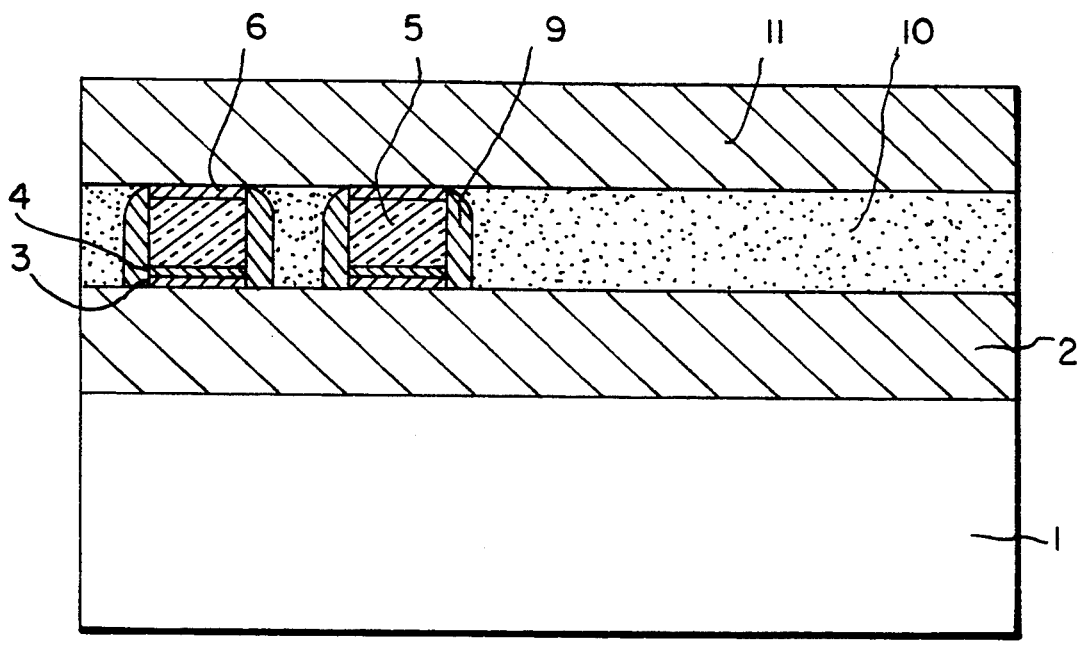
FIG. 4 is a sectional view of a semiconductor device prepared in accordance with the method of the present invention.

The obtained two layer wiring structure has a perfectly flat interlayer insulating film, and lines of the second layer wirings were easily formed to a minimum size of 0.4 $\mu$m. In addition, as shown in FIG. 4, the level difference produced by the formation of the first wiring layer was completely eliminated by this invention even at portions where the first wiring layer does not exist at all. In addition, the connection resistance at a through hole having a diameter of 0.7 $\mu$m was sufficiently small, i.e., 0.2 $\Omega$ per hole, and the percent of nondefective semiconductor devices was a satisfactory value of higher than 95%.

In this embodiment, sidewalls 9 are formed on the side faces of the first wiring layer. When the solution for forming the SOG film contains organic substances, the reliability of the lamination of the first wiring layer can be enhanced by avoiding direct contact of the SOG film 10 and the first wiring layer. Moreover, according to this invention, formation of the sidewalls 9 enhances the reliability of the semiconductor device and enhances the treatment of the upper surface of the titanium nitride film 6 performed in the anisotropic etching, so that the number of process steps can be minimized.

Figure 5A:
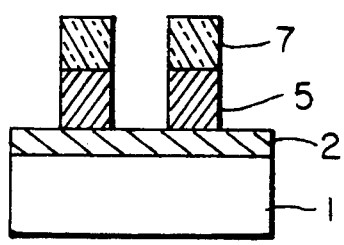
FIGS. 5a to 5h are sectional views illustrating in sequence a second embodiment of the method of the present invention.
Figure 5B:
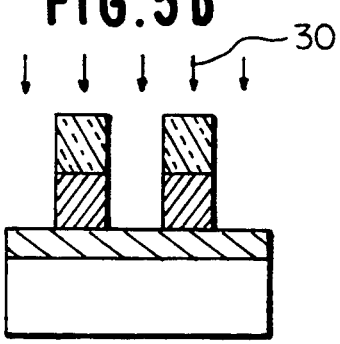
Figure 5C:
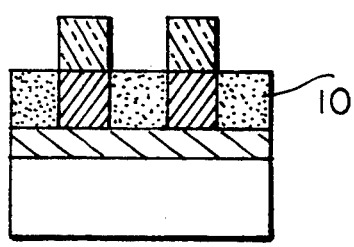
Figure 5D:
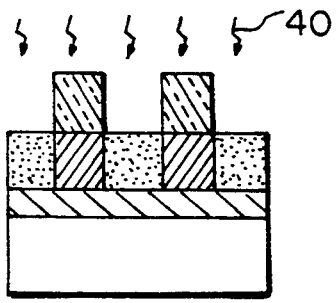
Figure 5E:
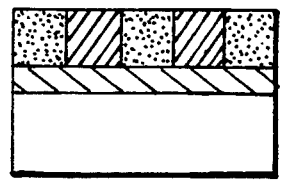
Figure 5F:
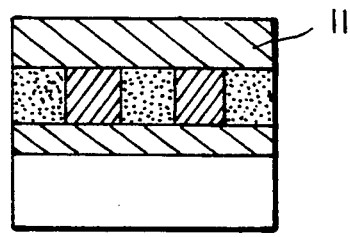
Figure 5G:
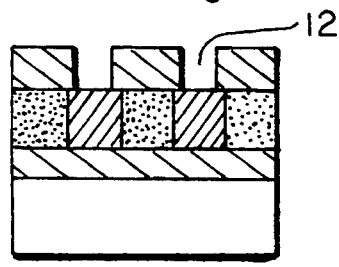
Figure 5H:
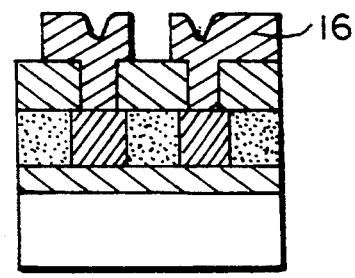

Next, referring to FIGS. 5a–5h, the second embodiment of the present invention will be described. First, as shown in FIG. 5a, after sequential formation of a BPSG film 2 with a thickness of about 0.7 $\mu$m and an aluminum film with a thickness of about 0.8 $\mu$m on a semiconductor substrate 1, a first layer aluminum wiring 5 is formed using a conventional photolithography technique. At this time, the photoresist film 7 is not removed. Next, as shown in FIG. 5b, the surface of the photoresist film is treated for 5 min with CF$_4$ gas plasma 30 at a pressure of 30 Pa and at a high frequency power of 200 W. Since an isotropic etching condition is employed in this embodiment, not only the top surface but also the side surfaces of the photoresist film 7 undergo the treatment. The treatment to the photoresist film 7 makes it difficult to form a SOG film on it when it is subsequently coated later with a coating solution for formation of an SOG film. Then, as shown in FIG. 5c, a SOG film 10 with a thickness of about 0.8 $\mu$m is formed. Although the side faces of the first layer of aluminum wiring 5 have been treated by the CF$_4$ gas plasma, the first layer aluminum wiring 5 is more easily coated with the SOG film compared with the similarly treated photoresist film 7, so the SOG film is selectively formed between the wirings, as in the first embodiment. The solution and the conditions employed for formation of the SOG film are the same as those in the first embodiment. Next, as shown in FIG. 5d, the SOG film is exposed to the fluorotriisopropoxysilane [FSi(OC$_3$H$_7$)$_3$] vapor 40 for 60 min at a pressure of 760 Torr and a temperature of 25° C. Next, as shown in FIG. 5e, the photoresist film 7 is removed by ashing it in an O$_2$ plasma. Subsequently, after annealing in N$_2$ for 60 min at 300° C., a silicon oxide film 11 having a thickness of about 0.7 μm is formed by a plasma excited CVD method as shown in FIG. 5f. Next, as shown in FIG. 5g, after formation of through holes 12 at predetermined locations, a second layer of aluminum wiring 16 is formed.

According to this embodiment, it is possible to form a SOG film 10 selectively between the first layer wirings, and moreover it is possible to make the SOG film 10 compact at a low temperature, such as room temperature, by exposing the film to the fluoroisopropoxysilane vapor. Further, since the SOG film is not formed on the photoresist film, it is possible to facilitate the subsequent removal of the photoresist film. Furthermore, the SOG film can be made compact even at a low temperature, such as room temperature, so it is possible to prevent melting of the SOG film at the time of removal of the photoresist film.

Determination of the through hole resistance using a test pattern which included 10,000 series-connected through holes in a two layer aluminum wiring structure showed a sufficiently small value of 120 mΩ per via hole, and the percent of nondefective was higher than 95%.

Figure 6A:
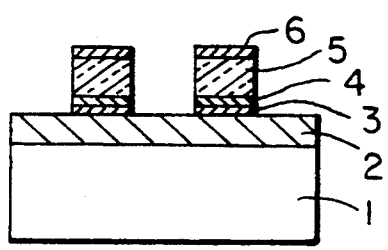
FIGS. 6a to 6g are sectional views illustrating in sequence a third embodiment of the method of the present invention.
Figure 6B:
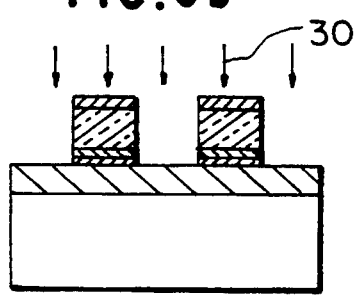
Figure 6C:
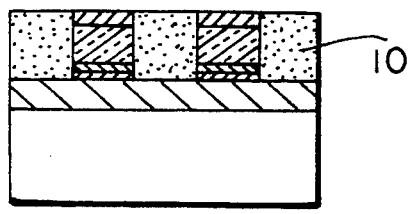
Figure 6D:
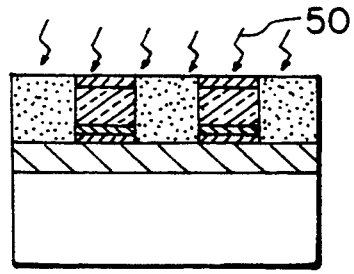
Figure 6E:
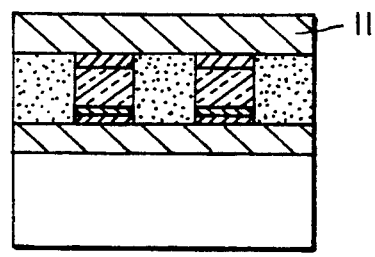
Figure 6F:
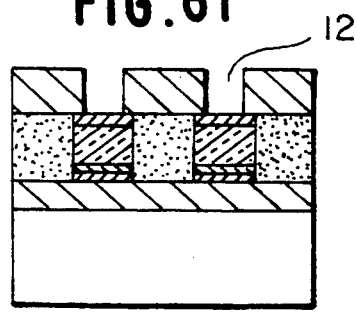
Figure 6G:
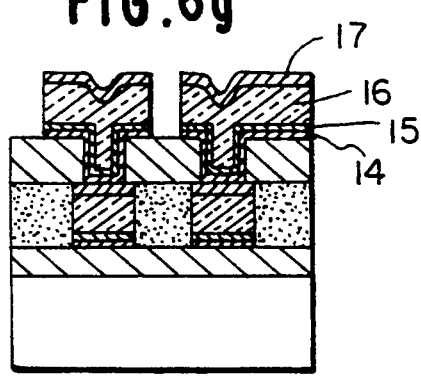

Referring now to FIGS. 6a to 6g, there is shown the fabricating steps for manufacturing a two layer aluminum wiring structure according to a third embodiment of the invention. First, as shown in FIG. 6a, after forming a BPSG film 2 having a thickness of about 0.8 μm is formed by CVD method on a semiconductor substrate 1, a first layer wiring including a titanium film 3 having a thickness of about 0.1 μm, a titanium nitride film 4 having a thickness of about 0.1 μm, a copper and silicon containing aluminum film 5 having a thickness of about 0.5 μm and a titanium nitride film 6 having a thickness of about 0.1 μm is formed using conventional sputtering and lithography techniques. Next, as shown in FIG. 6b, the surface of the titanium nitride film at the top part of the wiring is treated for 2 min with CF$_4$ gas plasma 30 in a reactive ion etching using CF$_4$ gas at a gas pressure of 10 Pa and a high frequency power of 1 kW. Following that, as shown in FIG. 6c, a SOG film 10 is formed selectively to a thickness of about 0.8 μm at locations other than where the wirings are located. Next, as shown in FIG. 6d, the SOG film is exposed to fluorotrimethoxysilane [FSi(OCH$_3$)$_3$] vapor 50 for 30 min at a pressure of 500 Torr and at a temperature of 25° C. Next, as shown in FIG. 6e, after annealing with N$_2$ for 60 min at a temperature of 300° C., a silicon oxide film 11 with a thickness of about 0.7 μm is formed by a plasma excited CVD method. Following that, as shown in FIG. 6f, through holes 12 are formed by a conventional photolithography technique. Next, as shown in FIG. 6g, a second layer wiring including a titanium film 14 with a thickness of about 0.1 μm, a titanium nitride film 15 having a thickness of about 0.1 μm, a copper and silicon containing aluminum film 16 having a thickness of about 0.5 μm and a titanium nitride film 17 having a thickness of about 0.1 μm is formed.

The two layer wiring structure obtained has excellent characteristics similar to those of the first and the second embodiments.

A similar effect can also be obtained by the materials and the conditions used in the first through the third embodiments described above. For example, the gas to be used for the treating for prevent the SOG film being made on the wiring or the photoresist film suffices if it includes at least one of carbon fluoride compounds or sulfur fluoride compounds.

Preferably, the coating solution for forming the SOG film used in the methods of the present invention is formed using an oligomer having a mean molecular weight 500 to 5000 g/mol and formed with one or more of silanol [Si(OH)$_4$], alkylsilanol [R'$_n$Si(OH)$_{4-n}$] where R' is an alkyl group and n is an integer from 1 to 3, tetraalkoxysilane, [Si(OR)$_4$] where R is an alkyl group as defined above, alkylalkoxysilane [R'$_n$Si(OR)$_{4-n}$] where R and R' are alkyl groups as defined above and n is an integer from 1 to 3, hydrogenated silanol [H$_n$Si(OH)$_{4-n}$] where n is an integer from 1 to 3, and hydrogenated alkoxysilane [H$_n$Si(OR)$_{4-n}$] where R is an alkyl group and n is an integer from 1 to 3, as the starting material. Any suitable solvent including alcohols, ethers, and ketones and mixtures thereof may be used in the present invention. Further, the exposure to the fluoroalkoxysilane vapor is characterized in that it may be carried out under low pressure, atmospheric pressure or high pressure. The temperature of the semiconductor substrate may be room temperature and preferably is below 150° C. The vapor of fluoroalkoxysilane has only to be formed by vaporization at a temperature below 100° C.

Further, the etching mask for forming the wiring may be a polyimide resin film, a fluorinated resin film or a photoresist film. Further, insulating film 11 may be a silicon oxide film, a silicon nitride film, a silicon oxynitride film, a fluorine-containing silicon oxide film formed by a CVD method, or a sputtering method, or a fluorine-containing silicon oxide film formed by liquid phase epitaxy using a supersaturated aqueous solution of hydrofluorosilicic acid. In addition, the first and the second metal wiring layers, may be aluminum, aluminum alloy, polysilicon, gold, titanium, tungsten, molybdenum and copper, a metallic silicide film, a laminated wiring structure which independently has, between upper and lower films of the aforementioned metals, one or more of a titanium containing tungsten film, a titanium nitride film, a titanium film, a polysilicon film and an amorphous silicon film.

Furthermore, although the present invention has been described in connections with a two layer wiring structure, the present invention can be used in the fabrication of wiring structures having three or more layers.

Although the present invention has been described in connection with a preferred embodiment thereof, many other variations and modifications will now become apparent to those skilled in the art without departure from the scope of the invention. It is preferred therefore that the present invention not be limited by the specific disclosure herein, but only by the appended claims.

What is claimed is:

1. A method of fabricating a semiconductor device, comprising the steps of
   a) forming a wiring on a semiconductor substrate having a first insulating film provided thereon;
   b) treating said wiring with a fluorine compound-containing gas;
   c) spin coating an insulating material onto said semiconductor substrate to form a planar surface on said substrate, the spin coated insulating material substantially not forming on the treated wiring;

d) exposing said spin coated insulating material to a fluoroalkoxysilane compound-containing vapor to compact said spin coated insulating material; and e) forming a second insulating film on said wiring and said compacted insulating material.

2. The method of claim 1, further comprising the step of forming a third insulating film on said wiring and anisotropically etching said third insulating film to form sidewalls on said wiring, said third insulating film being formed and anisotropically etched prior to the treatment of said wiring.

3. The method of claim 2, wherein said anisotropic etching comprises reactive ion etching using a gas selected from the group consisting of carbon fluoride gas and a sulfur fluoride gas.

4. The method as claimed in claim 1, wherein step b) comprises treating said wiring with a fluorine compound-containing gas selected from the group consisting of a carbon fluoride gas and a sulfur fluoride gas.

5. The method of claim 1, wherein step d) is carried out at a temperature below 150° C.

6. A method of fabricating a semiconductor device, comprising the steps of:
(a) forming a mask pattern of organic material on a semiconductor substrate having a metallic film and a first insulating film formed thereon;
(b) etching said metallic film using said mask pattern as a mask to form a wiring;
(c) treating said mask pattern with a fluorine compound-containing gas;
(d) spin coating an insulating film on the surface of said first insulating film and said metallic film etched in step (b);
(e) exposing said spin coated insulating film to a fluoroalkoxysilane vapor to compact the spin coated insulating film; and
(f) removing said mask pattern and forming a second insulating film on said wiring and said spin coated insulating film.

7. The method of claim 6, wherein said fluorine compound-containing gas is selected from the group consisting of carbon fluoride gas and sulfur fluoride gas.

8. The method of claim 6, wherein said spin coated insulating film is exposed to said fluoroalkoxysilane vapor at a temperature below 150° C.

9. A method of manufacturing a semiconductor device comprising the steps of:
forming a wiring pattern on an insulating film covering a semiconductor substrate, said wiring pattern including first and second patterns having a space therebetween;
exposing said wiring pattern to a gas including a fluorine compound; and
spin-coating an insulating material on said insulating film having thereon said wiring pattern which has been exposed to said gas including said fluorine compound, said insulating material being thereby coated in said space between said first and second patterns with leaving at least a top surface of each of said first and second patterns exposed.

10. The method as claimed in claim 9, wherein said step of forming said wiring pattern comprises the steps of forming first and second conductive layers on said insulating film, forming an insulating layer on said first and second conductive layers and said insulating film, and etching back said insulating layer until a top surface of each of said first and second conductive layers is exposed to thereby form an insulating side wall on each of side surfaces of said first and second conductive layers, said space between said first and second patterns being thereby defined by the insulating side walls formed on the side surfaces of said first and second conductive layers facing with each other, said insulating material filling said space in contact with the insulating side walls formed on the side surfaces of said first and second conductive layers.

11. The method as claimed in claim 10, wherein said step of etching back said insulating layer is carried out by use of a gas including a fluorine compound to thereby expose said wiring pattern to said gas including said fluorine compound, and said method further comprises the step of forming an additional insulating film on said insulating material filling said space and said top surface of each of said first and second patterns.

12. The method as claimed in claim 9, wherein said step of forming said wiring pattern comprises the steps of forming a conductive layer on said insulating film, forming a photoresist pattern on said conductive layer, and selectively removing said conductive layer by using said photoresist pattern as a mask, each of said first and second patterns being thereby composed of a part of said conductive layer and a part of said photoresist pattern formed on a top surface of said part of said conductive layer, and said insulating material being coated in said space in contact with side surfaces of said parts of said conductive layer of said first and second patterns without being formed on said photoresist pattern.

13. The method as claimed in claim 12, further comprising the steps of removing said photoresist pattern to expose the top surface of said parts of said conductive layer of said first and second patterns and forming an additional insulating film on said insulating material and the top surfaces of said parts of said conductive layer.

14. The method as claimed in claim 9, wherein said step of forming said wiring pattern comprises the steps of forming a conductive layer on said insulating film and selectively removing said conductive layer to form said first and second patterns each composed of a part of said conductive layer.

* * * * *